United States Patent
Fujii et al.

[11] Patent Number: 5,943,568
[45] Date of Patent: Aug. 24, 1999

[54] METHOD OF MAKING A SEMICONDUCTOR DEVICE

[75] Inventors: Eiji Fujii, Osaka; Atsuo Inoue, Kyoto; Koji Arita, Osaka; Toru Nasu, Kyoto; Akihiro Matsuda, Osaka, all of Japan

[73] Assignee: Matsushita Electronics Corporation, Osaka, Japan

[21] Appl. No.: 08/811,664

[22] Filed: Mar. 5, 1997

Related U.S. Application Data

[62] Division of application No. 08/492,690, Jun. 20, 1995, Pat. No. 5,644,158.

[30] Foreign Application Priority Data

Jun. 21, 1994 [JP] Japan ...................................... 6-138689

[51] Int. Cl.$^6$ .............................................. H01L 21/8242
[52] U.S. Cl. ......................... 438/240; 438/253; 438/241; 438/396
[58] Field of Search .................................. 438/253, 240, 438/241, 396

[56] References Cited

U.S. PATENT DOCUMENTS 5,316,982  5/1994  Taniguchi .............................. 437/236

*Primary Examiner*—John F. Niebling
*Assistant Examiner*—Lynne A. Gurley
*Attorney, Agent, or Firm*—McDermott, Will & Emery

[57] ABSTRACT

A method of making a semiconductor device include forming: (a) a semiconductor substrate on whose surface an integrated circuit is formed, (b) a first insulating layer on the semiconductor device and having first contact holes which lead to the integrated circuit, (c) a capacitance element on the first insulating layer, (d) a second insulating layer on the first insulating layer to cover the capacitance element, and having second contact holes which lead to an upper and a lower electrodes of the capacitance element respectively, and (e) interconnections which are connected to the integrated circuit and the capacitance element respectively through the first and second contact holes. The hydrogen density of this semiconductor device is $10^{11}$ atoms/cm$^2$ or less.

7 Claims, 4 Drawing Sheets

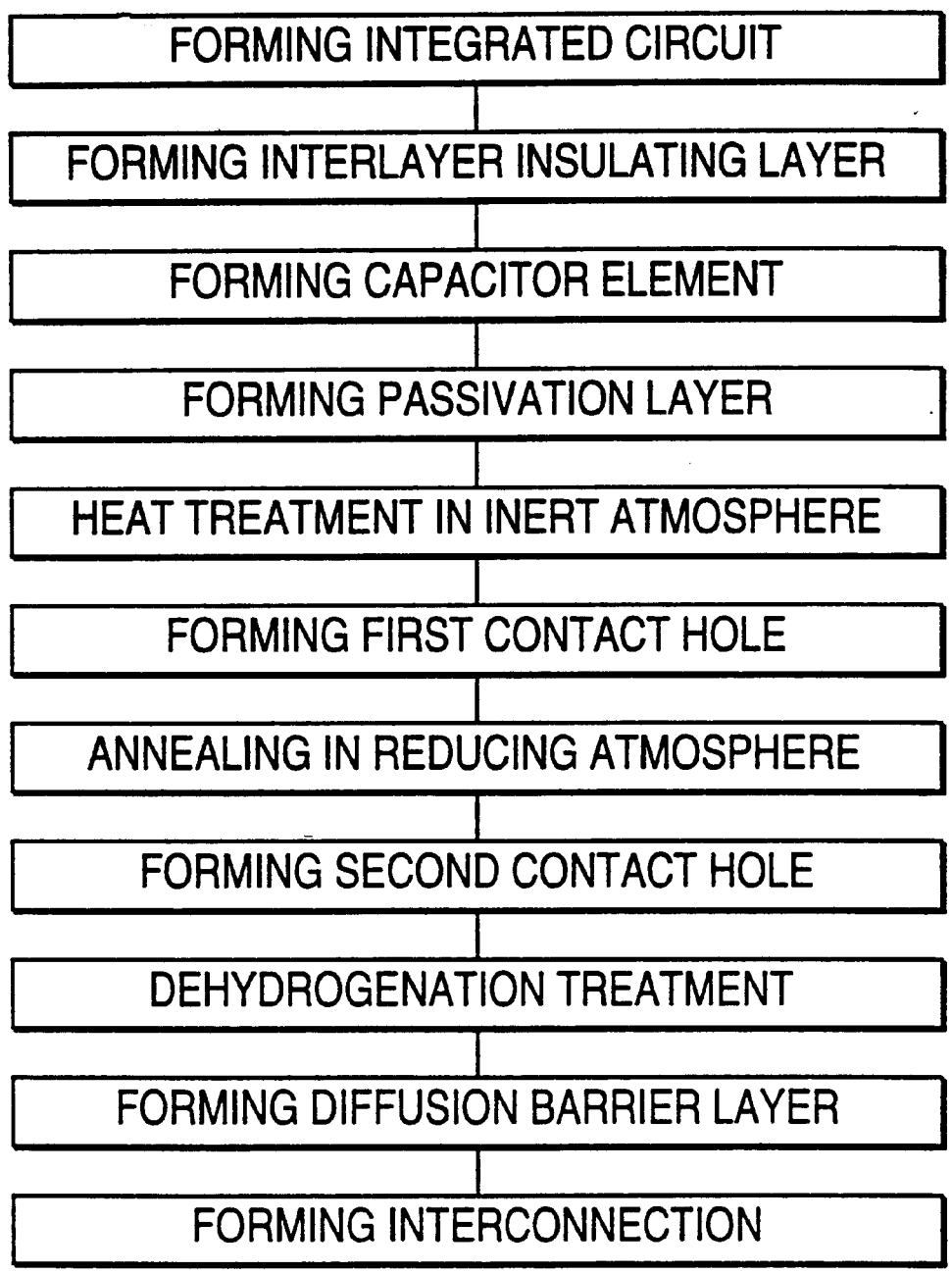

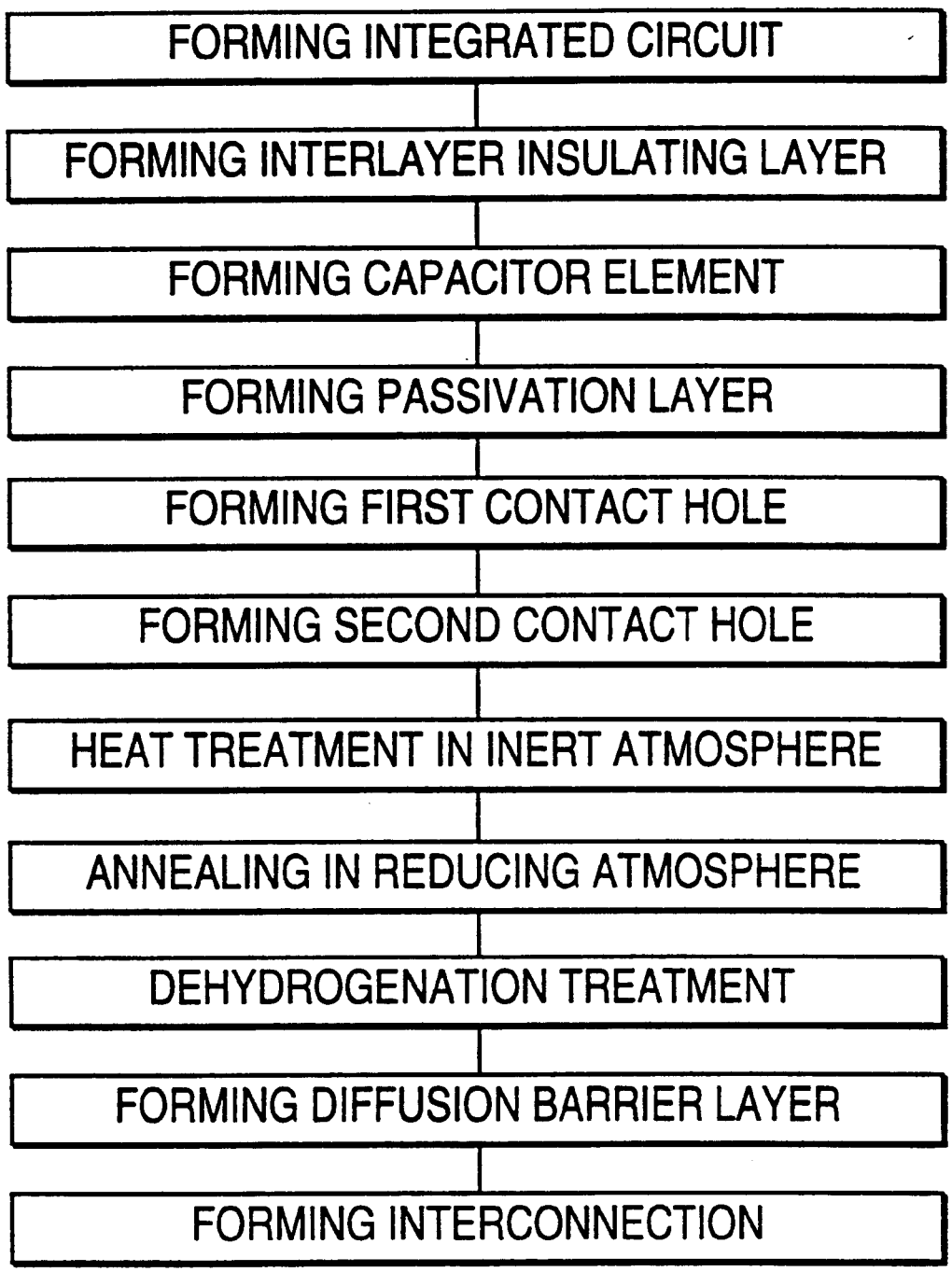

METHOD OF MAKING A SEMICONDUCTOR DEVICE

This is a continuation divisional of application Ser. No. 08/492,690, filed Jun. 20, 1995, now U.S. Pat. No. 5,644,158.

BACKGROUND OF THE INVENTION

The present invention relates to a semiconductor device incorporated with a capacitance element having a dielectric layer of a high dielectric constant, and a manufacturing method of the same.

The advancement of information and communication field requires large capacity data to be processed at a high speed. For realizing this request, more dense integration in semiconductor integrated circuit such as semiconductor memories is in progress. Also, reducing a chip space as well as a number of parts through more dense integration is promoted.

In this background, a technique to form capacitance elements using metal oxide dielectric materials having high dielectric constants in the semiconductor integrated circuit has been positively studied in recent years. The metal oxide dielectric materials having high dielectric constants include barium titanate (BTO), strontium titanate (STO), lead titanate zirconate (PZT). These dielectric materials have dielectric constants ranging as much as a few dozen to several hundreds times of those of silicon oxide and silicon nitride which are conventional dielectric materials for the capacitance elements incorporated in integrated circuits. Forming the capacitance element which uses a dielectric material of a high dielectric constant can substantially reduce an area occupied by the capacitance element in the integrated circuit comparing with the capacitance element using the conventional materials. As a result, more dense integration is achieved.

When incorporating the capacitance element which uses a ferroelectric layer such as PZT, a nonvolatile memory can be designed because such capacitance element has spontaneous polari-zation. For the spontaneous polarization remains even if applied electric field is removed, and thus, a memorized content will not be lost when being powered off.

A semiconductor device incorporated with the capacitance element using ferroelectric such as a semiconductor memory device is generally manufactured as follows:

First, form an isolation oxide layer on a silicon substrate, and then form a MOS transistor comprising a diffusion layer, gate insulating layer, and gate electrode. Next, form an interlayer insulating layer covering both the MOS transistor and isolation oxide layer, then form an capacitance element on the interlayer insulating layer. The capacitance element comprises three consecutive layers fabricated, namely, a lower electrode, ferro-electric layer, and upper electrode. After the capacitance element is formed, heat treatment is provided in the oxygen atmosphere where temperature ranges from 600° C. to 900° C. in order to improve the crystallinity by accelerating the sintering of ferroelectric layer upon necessity.

Second, cover the interlayer insulating layer including the capacitance element with a passivation layer, and then form first and second contact holes. The first contact holes lead to the diffusion layer passing through both the interlayer insulating layer and passivation layer. The second contact holes lead respectively to the lower and upper electrodes of the capacitance element passing through the passivation layer.

Third, form interconnections some of which touch the diffusion layer through the first contact holes as well as the other touch the lower and upper electrodes through the second contact holes.

The characteristics of semiconductor is deteriorated in the semiconductor memory device thus produced which is incorporated with the capacitance element using a metal-oxide-dielectric material, because oxygen reaches to the MOS transistor during the high-temperature heat treatment, and the surface state density increases on silicon interface.

The life of semiconductor memory devices using such dielectric materials is not always long enough. The reason is that the dielectric layer absorbs hydrogen. In general, when applying electric field to a capacitor made from a metal-oxide-dielectric material containing hydrogen gas, the hydrogen moves to form space charges. Therefore, when application of electric field is repeated, dielectric characteristic is deteriorated, which shortens the life of capacitor. A countermeasure to this deterio-rating of dielectric characteristic is proposed: Emit hydrogen from a dielectric material by annealing the dielectric material in inert gas or vacuum at 500° C. or higher temperature.

However, when this annealing method is applied to the above semiconductor memory device, the capacitance element has a large leakage current, and the life characteristic is not always improved.

SUMMARY OF THE INVENTION

A semiconductor device of the present invention comprises:
  (1) a semiconductor substrate on whose surface an integrated circuit is formed,
  (2) a first insulating layer formed on the semiconductor substrate,
  (3) a capacitance element formed on the first insulating layer, and
  (4) a second insulating layer formed on the first insulating layer to cover the capacitance element.

The above capacitance element comprises a lower electrode formed on the first insulating layer, dielectric layer formed on the lower electrode and having a high dielectric constant, and an upper electrode formed on the dielectric layer. The dielectric layer has a hydrogen density per unit area of $10^{11}$ atoms/cm$^2$ or less. The first insulating layer has first contact holes which lead to the integrated circuit, and the second insulating layer has second contact holes which lead to the upper electrode and lower electrode respectively. The interconnections are connected to the integrated circuit and capacitance element respectively passing through the first and second contact holes.

A manufacturing method of the semiconductor device according to the present invention comprises the steps of:
  (a) forming a first insulating layer on a surface of semiconductor substrate on which an integrated circuit is formed,
  (b) forming a capacitance element which uses a dielectric layer having a high dielectric constant on the first insulating layer,
  (c) forming a second insulating layer to cover the capacitance element on the first insulating layer,
  (d) forming first contact holes in the first and second insulating layers to lead to the integrated circuit in the first and second insulating layers,
  (e) forming second contact holes in the second insulating layer to lead to respectively a lower and an upper electrodes of the capacitance element,
  (f) annealing a dielectric material in hydrogen gas or mixed gas of hydrogen with inert gas at a temperature ranging from 350° C. to 500° C., (g) dehydrogenation treatment, after the annealing step, in any one of gases of oxygen, inert gas, and mixed gas of oxygen with inert gas at a temperature raging from 300° C. to 450° C., and (h) forming interconnections which are connected to the integrated circuit and capacitance element passing through the first and second contact holes.

The dielectric layer having a high dielectric constant means here a layer made from a dielectric material whose relative dielectric constant is 100 or more. This material includes not only a dielectric having a high dielectric constant such as STO but also a ferroelectric such as PZT.

A major feature of the present invention is to maintain a hydrogen density per unit area in the dielectric layer of the capacitance element at $10^{11}$ atoms/cm$^2$ or less. The inventors investigated the relation between a hydrogen density and a leakage current of the dielectric layer, and the relation between hydrogen density and breakdown time of dielectric layer. The results are shown in FIG. 1, where the left vertical axis indicates leakage current in the capacitance element and the right vertical axis indicates breakdown time of the dielectric layer when 1 MV/cm electric field is applied to the dielectric layer. A material of strontium titanate system was used for the dielectric layer, and platinum was used for the lower and upper electrodes.

As shown in FIG. 1, the leakage current lowers in response to the decrease of hydrogen density. When the hydrogen density decreases to $10^{11}$ particles/cm$^2$ or less, the leakage current lowers to minimum value. On the other hand, the breakdown time lengthens in response to the decrease of hydrogen surface density. When the hydrogen density decreases to $10^{11}$ atoms/cm$^2$ or less, the break-down time lengthens to the maximum hours. These phenomena are explained by the facts below:

(a) Schottky barrier height of the interfaces between the upper and lower electrodes and the dielectric layer heightens in response to the decrease of hydrogen density.

(b) A grain boundary potential height heightens in response to the decrease of hydrogen density.

When using a dielectric layer of which hydrogen density is $10^{11}$ atoms/cm$^2$ or less in a semiconductor device, the leakage current, therefore, becomes very small, and the life of the capacitance element becomes substantially long. For example, the life of a semiconductor device can be estimated 10 years or more when the semiconductor is kept at 125° C. and 5.5 V is applied to.

BRIEF DESCRIPTION OF THE DRAWINGS

FIG. 4 is a manufacturing process flow chart of the semiconductor device according to the second exemplary embodiment.

FIG. 5 is a manufacturing process flow chart of the semiconductor device according to the third exemplary embodiment.

DESCRIPTION OF THE PREFERRED EMBODIMENTS

Figure 1:
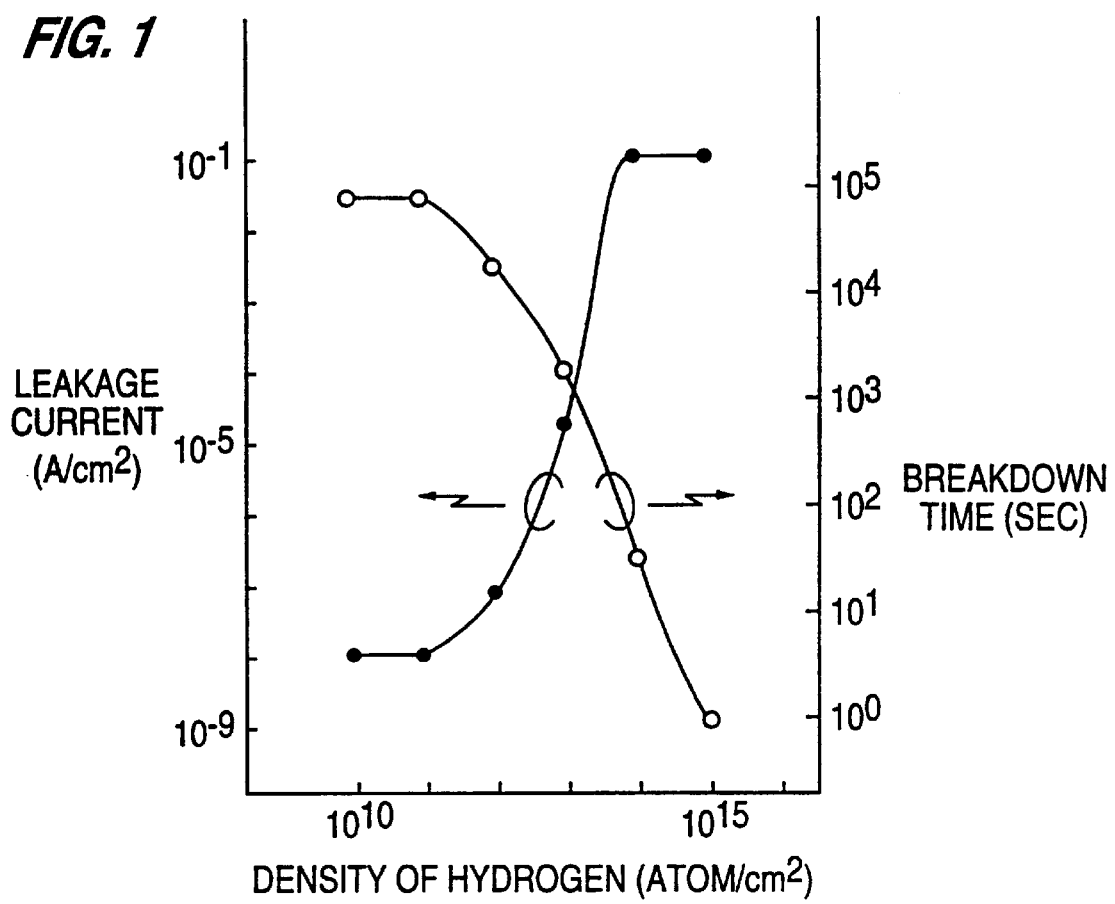
FIG. 1 illustrates the relation between the hydrogen density and leakage current of capacitance element, and the relation between the hydrogen density and the breakdown time of dielectric layer in the semiconductor device incorporated with the capacitance element.
Figure 2:
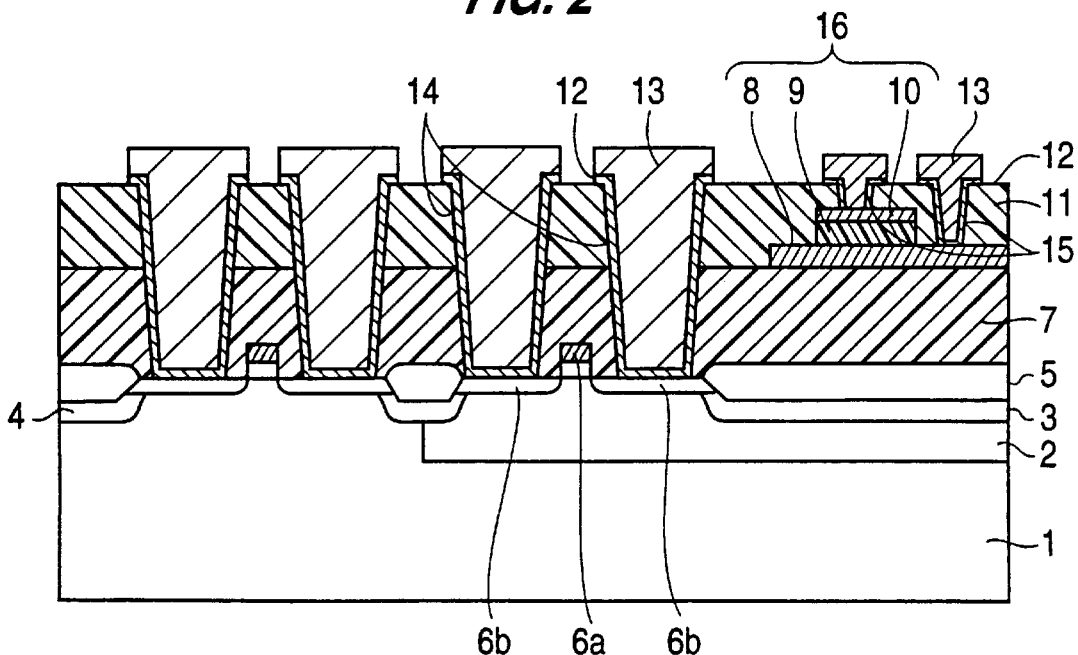
FIG. 2 is a schematic cross section of the semiconductor device according to the present invention.

A first exemplary embodiment of the present invention is explained by referring to FIG. 1 and FIG. 2:

First, on a P-type silicon substrate 1, form N-Well area 2, N+ area 3 for isolating elements, P+ area 4 for isolating elements, and thick oxide layer 5 for isolating element. Further, form an integrated circuit which is represented by a transistor comprising gate electrode 6a and diffusion area 6b by using a regular technique for forming a transistor. Then, form interlayer insulating layer 7 (a first insulating layer) to cover the integrated circuit area and the oxide layer 5 by using CVD method.

Second, form a thin-film-type capacitance element 16 on a specific area of interlayer insulating layer 7 using a sputtering method: laminate lower electrode 8 made from platinum, dielectric layer 9 made from STO and having a high dielectric constant, and upper electrode 10 made from platinum in this sequence.

Third, form passivation layer 11 (a second insulating layer) covering, at least, capacitance element 16 for the protection purpose by using CVD method. Then, form second openings 15 in passivation layer 11 by an etching method in order to connect lower electrode 8 and upper electrode 10 to interconnection 13.

Fourth, provide an one-hour heat treatment at 600° C. in nitrogen gas. The major purpose of this heat treatment is to recover the damage sustained to dielectric layer 9 by the etching and sputtering. This heat treatment should be provided in non-reducing gas atmosphere. The non-reducing gases include inert gas such as nitrogen gas, argon gas, helium gas, and also oxidizing gas such as oxygen gas and mixed gas of oxygen gas with inert gas. The heat treatment in this non-reducing gas should be provided at a temperature ranging from 300° C. to 800° C. for an appropriate time ranging from several minutes to several hours.

Fifth, form first openings in both interlayer insulating layer 7 and passivation layer 11 by an etching method for connecting interconnection 13 to gate electrode 6a and diffusion area 6b.

Sixth, provide an anneal treatment in reducing atmosphere comprising hydrogen and nitrogen at 400° C. This anneal treatment can lower the surface state density of gate insulating layer beneath gate electrode 6a, and thus a transistor characteristic is recovered. In this anneal treatment, reducing gas such as hydrogen gas, or mixed gas of hydrogen gas with inert gas is preferred to use. The anneal treatment temperature preferably ranges from 350° C. to 500° C. In this temperature range, some advantages are gained: (1) Hydrogen affects dielectric layer 9 to relatively small degree. (2) The surface state density can be lowered.

Seventh, dehydrogenation treatment is provided in inert atmosphere of nitrogen gas at 350° C. in order to remove hydrogen from dielectric layer 9. The hydrogen density is lowered to $10^{11}$ atoms/cm$^2$ or less by this dehydrogenation treatment. Inert gas such as argon gas or helium gas is preferable to use. Besides the inert gas, oxidizing gas such as oxygen gas, or mixed gas of oxygen gas with inert gas can be also used. This anneal treatment is preferably provided at a temperature ranging from 300° C. to 450° C. and for an appropriate time ranging from several minutes to several hours. When the treatment temperature rises over 450° C., the surface state density is again increased. On the other hand, when the treatment temperature lowers less than 300° C., hydrogen cannot be fully removed from dielectric layer 9.

Eighth, form diffusion-barrier-layer 12 made from titanium-tungsten alloy at first contact holes 14, the inside walls as well as bottoms of second contact holes 15, then form interconnection 13 made from aluminum.

In such a manufacturing process of semiconductor device, a heat treatment in non-reducing gas is provided before forming first contact holes 14. In this case, the surface state density does not increase so much because the integrated circuit is still covered by both interlayer insulating layer 7 and passivation layer 11. The surface state density, therefore, is lowered with ease by the anneal treatment in reducing atmosphere. Dielectric layer 9 absorbs hydrogen during the anneal treatment in reducing atmosphere; however, this hydrogen is removed by the dehydroge-nation treatment following the anneal treatment. Since this dehydrogenation treatment is provided at a low temperature ranging from 300° C. to 450° C., the hydrogen density of dielectric layer 9 can be lowered to $10^{11}$ atoms/cm$^2$ or less by keeping the surface state density of the integrated circuit at a low level.

A second exemplary embodiment is explained by referring to FIG. 4. The process order of the second exemplary embodiment between forming passivation layer and dehydrogenation treatment is different from that of the first exemplary embodiment shown in FIG. 3. The second embodiment however uses the same manufacturing condition in each process as that of the first embodiment.

First, prosecute the processes from forming a semiconductor device to forming passivation layer 11 same as those of the first embodiment.

Second, after the forming of passivation layer 11, provide a heat treatment to dielectric layer 9 in non-reducing gas, and then, form first contact holes before providing an anneal treatment in reducing atmosphere. Then, form second contact holes 15 followed by dehydrogenation treatment. Next, form diffusion barrier layer 12, then form interconnection 13.

The anneal treatment in the reducing atmosphere of the second embodiment is provided when capacitance element 16 is still covered by passivation layer 11, that is, before forming second contact holes 15. Hydrogen is thus difficult to be absorbed, and the hydrogen can be removed from dielectric layer 9 with ease to gain the hydrogen density of $10^{11}$ atoms/cm$^2$ or less easily.

A third exemplary embodiment is explained by referring to FIG. 5. The process order of the third exemplary embodiment between forming passivation layer and dehydrogenation treatment is different from either of the first exemplary embodiment shown in FIG. 3 or the second exemplary embodiment shown in FIG. 4. The third embodiment however uses the same manufacturing condition in each process as that of the first embodiment.

First, prosecute the processes from forming a semiconductor device to forming passivation layer 11 same as those of the first embodiment. After forming passivation layer 11, form the first and second contact holes 14, 15, then provide the heat treatment to dielectric layer 9 in the non-reducing gas, the anneal treatment in the reducing atmosphere, and dehydrogenation treatment successively.

Second, form diffusion barrier layer 12, and then form interconnection 13.

Since the dehydrogenation treatment in this third embodiment also follows the anneal treatment in the reducing atmosphere, the surface state density in the integrated circuit is lowered, and dielectric layer 9 of which hydrogen density is $10^{11}$ atoms/cm$^2$ or less. The first and second contact holes 14, 15 can be formed simultaneously although the third embodiment shows that the second contact holes 15 are formed after the first contact holes 14. Since the heat treatment in the non-reducing gas, the anneal treatment in the reducing atmosphe-e, and dehydrogenation treatment are provided successively, this manufacturing method achieves a high productivity.

Figure 3:
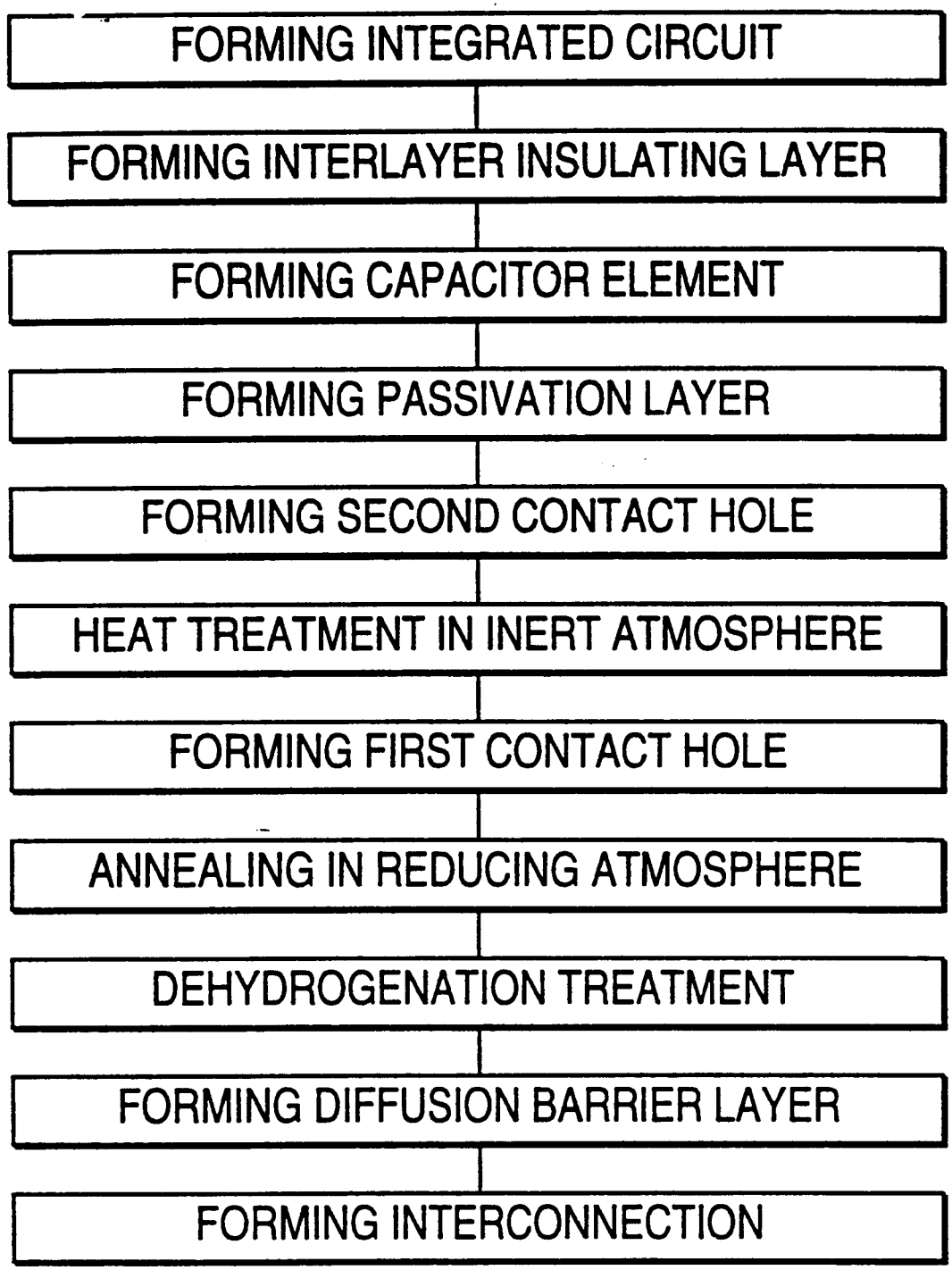
FIG. 3 is a manufacturing process flow chart of the semiconductor device according to the first exemplary embodiment.

In a fourth exemplary embodiment, a second time anneal treatment in reducing atmosphere is provided following the inter-connection forming at the first exemplary embodiment shown in FIG. 3. Then, provide a second time dehydrogenation treatment. The treatment conditions of these second time treatment, are the same as those of the first treatment respectively. This second time anneal treatment in the reducing atmosphere allows the surface state density to lower, most of which is produced at the integrated circuit when forming the interconnection. The second time dehydrogenation treatment allows the hydrogen to be removed, which is absorbed into dielectric layer 9 at the second time anneal treatment in the reducing atmosphere.

Through these second time treatments, a semiconductor device which has a better transistor characteristic and a lower hydrogen density than that of the first embodiment can be manufactured. If these second time treatments are provided following the interconnection forming processes of the second and third exemplary embodiments, the same effect as the fourth embodiment can be gained.

In a fifth exemplary embodiment, another anneal treatment at 400° C. in nitrogen gas is added after the interconnection forming process of the first embodiment shown in FIG. 3. This anneal treatment is expected to decrease the contact resistance between diffusion barrier layer 12 and the integrated circuit. This anneal treatment is preferably provided at a temperature ranging from 300° C. to 500° C. in inert gas such as nitrogen gas, argon gas, or helium gas in order to avoid oxidizing inter-connection 13 as well as prevent the surface state density from increasing again.

If this anneal treatment in inert gas for decreasing the contact resistance is provided after the interconnection forming process of the second and third embodiments, the same effect gained from the fourth embodiment can be produced. The hydrogen density of dielectric layer 9 is kept at $10^{11}$ atoms/cm$^2$ or less and would not be increased by this anneal treatment in inert gas.

The cases explained in the above exemplary embodiments are for the semiconductors incorporated with capacitance elements formed on a semiconductor substrate on which an integrated circuit is formed. Such a technique as maintaining the hydrogen density at $10^{11}$ atoms/cm$^2$ or less can be applied to an electronic circuit device incorporated with a capacitance element formed on an insulating substrate, such as a filter. An exemplary embodiment of an electronics circuit device is shown below:

First, form a lower electrode made from platinum on an alumina substrate, and form dielectric layer made from STO on the lower electrode. Then, form an upper electrode made from platinum on this dielectric layer. These lower electrode, dielectric layer and upper electrode are made by the regular sputtering method. Next, cover the capacitance element thus formed by a passivation layer made from silicone nitride using CVD method.

Second, provide a dehydrogenation treatment at 380° C. in inert atmosphere of nitrogen gas. The hydrogen density of the dielectric layer lowers to $10^{11}$ atoms/cm$^2$ or less through this dehydrogenation. Besides nitrogen gas, other inert gases such as argon gas and helium gas can be also used in the dehydrogenation treatment. Oxidizing gas such as oxygen gas, mixed gas of oxygen gas with inert gas can be used instead of the above gases. As for the treatment temperature, if the temperature is lower than 300° C., hydrogen is not removed enough, and if the temperature is higher than 450°

C., copper wirings wired on the insulating substrate are damaged more extensively. Accordingly, the treatment temperature is preferably set between 300° C. and 450° C. for between several minutes and several hours.

The present invention is not limited to the above exemplary embodiments, and various modifications are available. For example, perovskite-type metal-oxidizing-dielectric materials such as BTO, or PZT can be used as a material of the dielectric layer which is incorporated with a capacitance element having a high dielectric constant. Titanium nitride, titanium-tungsten nitride besides titanium-tungsten alloy can be used as a material of the diffusion barrier layer. An alloy whose major component is aluminum can be used besides aluminum for the interconnection material.

Other various modifications may be made in the details within the scope and range of equivalents of the claims and without departing from the spirit of the invention.

What is claimed is:

1. A method of manufacturing a semiconductor device, said method comprising the steps of:
    (a) forming a first insulating layer on a semiconductor substrate on whose surface an integrated circuit is formed;
    (b) forming a capacitance element on said first insulating layer, said capacitance element comprises a lower electrode, dielectric layer formed on said lower electrode and having a high dielectric constant, and an upper electrode formed on said dielectric layer;
    (c) forming a second insulating layer to cover said capacitance element on said first insulating layer;
    (d) forming first contact holes, which lead to said integrated circuit, in said first and second insulating layers;
    (e) forming second contact holes, which lead to said upper and lower electrodes, in said second insulating layer;
    (f) annealing in reducing atmosphere made from hydrogen gas or mixed gas of hydrogen with inert gas, at a temperature ranging from 350° C. to 500° C.;
    (g) a dehydrogenation treatment after said annealing step, wherein heat is applied at a temperature ranging from 300° C. to 450° C. in one of the gases of oxygen gas, inert gas, and mixed gas of the oxygen gas and inert gas, said dielectric layer having a hydrogen density which is reduced by said dehydrogenation treatment such that said hydrogen density is no more than $10^{11}$ atoms/cm$^2$; and
    (h) forming interconnections which are connected to said integrated circuit and said capacitance element passing through said first and second contact holes.

2. The method of manufacturing a semiconductor device of claim 1, wherein the steps of (d), (e), (f), and (g) follow this sequence: (e), (d), (f), (g), and further comprising,
    a step of heat treatment added to between the step (e) and the step (d), wherein a temperature ranges from 300° C. to 800° C. in one of the gases of inert gas, oxygen gas, and mixed gas of the inert and oxygen gas.

3. The method of manufacturing a semiconductor device of claim 1, wherein the steps of (d), (e), (f), and (g) follow this sequence: (d), (f), (e), (g), and further comprising
    a step of heat treatment added prior to the step (d), wherein a temperature ranges from 300° C. to 800° C. in one of the gases of inert gas, oxygen gas, and mixed gas of the inert gas with oxygen gas.

4. The method of manufacturing a semiconductor device of claim 1, wherein the steps of (d), (e), (f) and (g) follow this sequence: (d), (e), (f), (g), and further comprising
    a step of heat treatment added to between the step (e) and the step (f), wherein a temperature ranges from 300° C. to 800° C. in one of the gases of inert gas, oxygen gas, and mixed gas of the inert gas with oxygen gas.

5. The method of manufacturing a semiconductor device of claim 1, wherein the step (f) of annealing and the step (g) of dehydrogenation treatment are added prior to said interconnection forming step (h), and further comprising
    additional annealing following said interconnection forming step, wherein a temperature ranges from 350° C. to 500° C. in reducing atmosphere comprising one of the gases of hydrogen gas and mixed gas of the hydrogen gas with inert gas, and
    additional dehydrogenation treatment step following said second additional annealing, wherein a temperature ranges from 300° C. to 450° C. in one of the gases of oxygen gas, inert gas, and mixed gas of oxygen gas with inert gas.

6. The method of manufacturing a semiconductor device of claim 1, wherein another annealing for decreasing the contact resistance at a temperature ranging from 300° C. to 500° C. in inert atmosphere is added after said interconnection forming step (h).

7. A method of manufacturing an electronic circuit device, said method comprising the steps of:
    (a) forming a capacitance element which comprises a lower electrode, dielectric layer formed on said lower electrode and having a high dielectric constant, and an upper electrode formed on said dielectric layer, on an insulating substrate; and
    (b) a dehydrogenation treatment applying heat at a temperature ranging from 300° C. to 450° C. in one of the gases of oxygen gas, inert gas, and mixed gas of oxygen gas with inert gas, said dielectric layer having a hydrogen density which is reduced by said dehydrogenation treatment such that said hydrogen density is no more than $10^{11}$ atoms/cm$^2$.

* * * * *